(12) United States Patent
Pierce et al.

(10) Patent No.: US 6,183,562 B1
(45) Date of Patent: *Feb. 6, 2001

(54) THERMAL PROTECTION SYSTEM FOR A CHEMICAL VAPOR DEPOSITION MACHINE

(75) Inventors: Tracy Lavalle Pierce, Lake Hills; Douglas A. Czaja, San Antonio, both of TX (US)

(73) Assignees: Sony Corporation of Japan, Tokyo (JP); Sony Electronics, Inc., Park Ridge, NJ (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/996,961

(22) Filed: Dec. 23, 1997

(51) Int. Cl.$^7$ ..................................... C23C 16/52
(52) U.S. Cl. .................. 118/707; 118/712; 118/725; 118/666; 432/36; 432/54
(58) Field of Search .................. 118/715, 725, 118/666, 667, 708, 707, 712; 432/36, 54

(56) References Cited

U.S. PATENT DOCUMENTS

| | | | |
|---|---|---|---|
| 4,334,541 | * 6/1982 | Leist et al. ............................. | 128/632 |
| 5,151,871 | * 9/1992 | Matsumura et al. .................. | 364/557 |
| 5,562,947 | * 10/1996 | White et al. ............................ | 118/725 |
| 5,589,421 | * 12/1996 | Miyashita et al. .................... | 118/715 |
| 5,595,241 | * 1/1997 | Jelinek .................................... | 118/725 |
| 5,640,059 | * 6/1997 | Kammiller et al. .................... | 307/66 |
| 5,653,806 | * 8/1997 | Van Buskirk ........................... | 118/724 |

* cited by examiner

*Primary Examiner*—Shrive Beck
*Assistant Examiner*—Bret Chen
(74) *Attorney, Agent, or Firm*—Wagner, Murabito & Hao LLP

(57) ABSTRACT

A thermal protection system for a chemical vapor deposition machine (CVD). The system of the present invention includes a thermal sensor for providing a temperature signal corresponding to a CVD chamber temperature, a heating component for heating the CVD chamber, and a controller for regulating the CVD chamber temperature. The controller is coupled to receive the temperature signal and to control the heating component in response thereto. An interlock circuit is coupled between the heating component and the controller. The interlock circuit has an open state and a closed state. A comparison circuit is coupled to receive the temperature signal and coupled to control the interlock circuit, wherein the comparison circuit effects a comparison between the temperature signal and a reference and commands the interlock to the open state when the temperature signal exceeds the reference. In so doing, the comparison circuit protects the CVD chamber from an over-temperature condition that might not otherwise be prevented by the controller.

21 Claims, 4 Drawing Sheets

THERMAL PROTECTION SYSTEM FOR A CHEMICAL VAPOR DEPOSITION MACHINE

FIELD OF THE INVENTION

The field of the present invention involves semiconductor fabrication processing equipment. More particularly, the present invention pertains to a circuit for use with chemical vapor deposition machines.

BACKGROUND OF THE INVENTION

Semiconductor wafer fabrication involves many complex and highly precise processes. Many of these processes are highly dependent on the precise control of process temperature. Small variations in temperature can have detrimental effects on the resulting semiconductor devices. One such fabrication process is chemical vapor deposition. Chemical vapor deposition (CVD) is a widely used process for depositing thin films of a variety of materials. In addition to semiconductor electronics, applications of CVD include the deposition of protective coatings for other applications (e.g., optics, mechanical parts, etc.).

In a typical CVD process, a mixture of reactant gases (often diluted in a carrier gas) at room temperature are injected into a CVD reaction chamber. The gas mixture, as it approaches a deposition surface (e.g., a semiconductor wafer), is heated radiatively by thermal lamps, or alternatively, placed upon a heated substrate. Depending on the precise process temperature and operating conditions, the gas mixture typically undergoes homo geneous chemical reactions in the vapor phase before striking the deposition surface. Near the surface, thermal, momentum, and chemical concentration boundary layers form as the gas stream heats, slows down, and the chemical composition changes. Heterogeneous reactions of within the gas mixture subsequently occur at the deposition surface, forming the deposited material (e.g., thin film). The resulting reaction by-products are then transported out of the CVD reaction chamber.

The characteristics and the results of the CVD process very much depend on controlling the process temperature. High temperatures are often used (e.g., 280 C.). The precise operating temperature within the CVD chamber is typically regulated and maintained by an embedded computer system within the CVD machine. This computer system implements a software defined process for heating the CVD chamber, following a temperature profile during processing, and protecting the components comprising the CVD machine from being damaged by excessive heat.

There is a problem, however, in that under certain conditions, errors can occur with the embedded computer system and its software. The computer systems of CVD machines and their controlling software are thoroughly tested and exhaustively examined prior to use of the machines in a fabrication line. As such, any errors which may occur are usually of little or no consequence, since a typical CVD machine includes a variety of error handling routines to diagnose and fix such errors. On occasion, however, an error of sufficient severity may occur which results in the scrapping of wafers undergoing processing. Even worse, under certain conditions, a catastrophic error may occur which results in damage to the CVD machine itself. One such catastrophic error is thermal "lock up".

Thermal lock up refers to a condition where the embedded computer system controlling the CVD machine malfunctions and looses the ability to shut off heating components (e.g., radiant thermal lamps within the CVD chamber). For example, in the case where a CVD machine is processing a wafer and following a process temperature profile, the embedded computer system modulates the heating elements, alternately turning them on and off, to achieve and maintain a desired temperature within the CVD chamber. If a malfunction occurs during a period when the heating elements are "on", the embedded computer system may loose the ability to subsequently turn them "off". For example, if the embedded computer system "locks up" (e.g., due to a software error or a power supply voltage glitch) after having commanded the heating elements on, the command to turn the heating elements off may not be issued. Consequently, the temperature within the CVD chamber "runs away," increasing to the point at which some components within the CVD chamber are significantly damaged.

The cost of repairing the CVD machine can be very high. A modern CVD machine is an extremely accurate, complex device. In addition to the costs of repairing the CVD machine itself, however, are the costs associated with the machine's lost productivity. A typical wafer fabrication line involves the production of hundreds, and perhaps thousands, of semiconductor components daily. The interruption in production could be much more costly than the cost attributed to repairing of the CVD machine.

SUMMARY OF THE INVENTION

Accordingly, what is needed is a system which protects against thermal lock up in CVD machines. What is needed is a system which remains functional should the embedded systems within a CVD machine fail. What is needed is yet a system which is easily integrated with existing CVD machines in existing wafer fabrication lines. What is needed is a system which provides protection against thermal lock up without interfering with sensor inputs and outputs used by the embedded systems within the CVD machines. The present invention provides an advantageous solution which satisfies the above requirements.

The present invention provides a system which protects against thermal lock up in CVD (chemical vapor deposition) machines. The system of the present invention remains functional should the embedded systems within a CVD machine fail. The system of the present invention is easily integrated with existing CVD machines in existing wafer fabrication lines. In addition, the present invention provides protection against thermal lock up without interfering with sensor inputs and outputs used by the embedded systems within the CVD machines (e.g., a CVD machine's controller).

In one embodiment, the present invention includes a thermal protection system for a CVD machine. The system of the present invention includes a thermal sensor for providing a temperature signal corresponding to a CVD chamber temperature, a heating component for heating the CVD chamber, and a controller for regulating the CVD chamber temperature. The controller is coupled to receive the temperature signal and to control the heating component in response thereto. An interlock circuit is coupled between the heating component and the controller. The interlock circuit has an open state and a closed state. A comparison circuit is coupled to receive the temperature signal and coupled to control the interlock circuit, wherein the comparison circuit effects a comparison between the temperature signal and a reference and commands the interlock to the open state when the temperature signal exceeds the reference. In so doing, the comparison circuit protects the CVD chamber from an over-temperature condition.

In an alternate embodiment, the present invention includes a comparison circuit capable of easily retrofitting a pre-existing CVD machine. The comparison circuit of the present invention is coupled in parallel to a temperature signal of the CVD machine and has a high input impedance to avoid distorting the temperature signal. The comparison circuit is coupled to control an interlock between the CVD machine's controller and heating component. When the comparison circuit detects an over-temperature condition, the comparison circuit commands the interlock to the open state.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, a thermal protection system for a chemical vapor deposition machine, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention provides a system which protects against thermal lock up in CVD (chemical vapor deposition) machines. The system of the present invention remains functional should the embedded systems within a CVD machine fail. The system of the present invention is easily integrated with existing CVD machines in existing wafer fabrication lines. In addition, the present invention provides protection against thermal lock up without interfering with sensor inputs and outputs used by the embedded systems within the CVD machines. The present invention and its benefits are further described below.

Figure 1A:
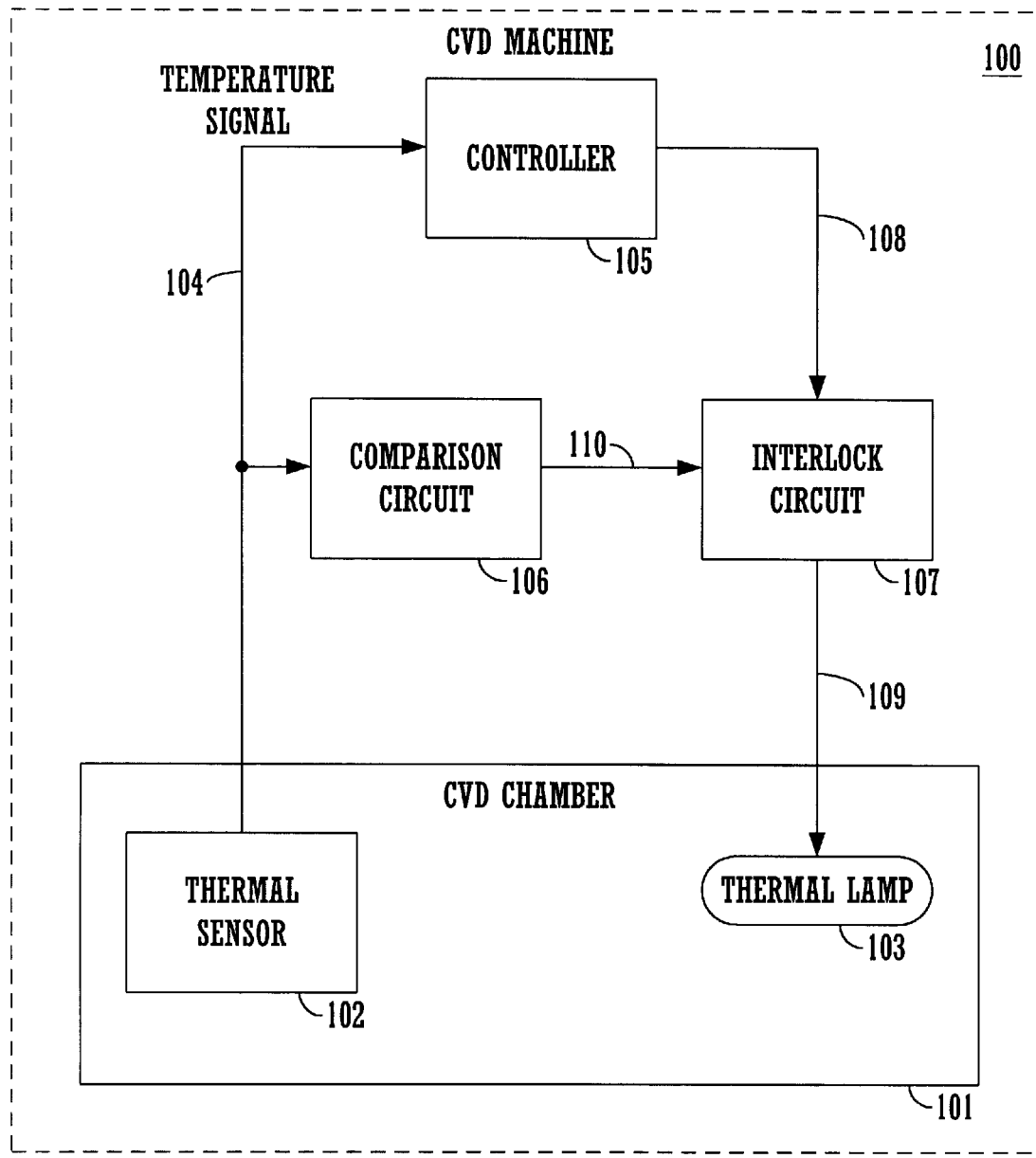
FIG. 1A shows a block diagram of a CVD machine in accordance with one embodiment of the present invention.

Referring now to FIG. 1A, a diagram of the system of the present invention in accordance with one embodiment is shown. FIG. 1A shows a CVD machine 100 implemented in accordance with the present invention. CVD machine 100 includes a CVD chamber 101 having a thermal sensor 102 and a thermal lamp 103. Thermal sensor 102 supplies a temperature signal over line 104 to controller 105 and to a comparison circuit 106 coupled in parallel. The controller 105 supplies a controller output over line 108 to an interlock circuit 107, which in turn, supplies a interlock circuit output over line 109 to control thermal lamp 103. Interlock circuit 107 also receives a comparison circuit output over line 110 from comparison circuit 106.

CVD machine 100 functions by utilizing precisely controlled chemical reactions to deposit thin films of material on the surface of a semiconductor wafer (not shown). The chemical reactions and the semiconductor wafer are contained within CVD chamber 101. The chemical reactions are highly dependent upon the temperature within CVD chamber 101. CVD machine 100 uses controller 105 to modulate the thermal output of thermal lamp 103, which in turn, controls the temperature within the CVD chamber 101.

For example, controller 105 is typically an embedded computer system (e.g., processor coupled to a bus which is coupled to one or more memory units) which executes computer readable software code to control the operation of CVD machine 100. To control the deposition process, controller 105 modulates the thermal output of thermal lamp 103 to follow a temperature profile of the CVD chamber 101. The temperature profile describes the desired temperature within CVD chamber 101 over process time, from the start of a process cycle to the end. Controller 105 "turns on" thermal lamp 103 to increase the temperature within CVD chamber 101 when the chamber temperature is below the temperature profile and "turns off" thermal lamp 103 when the chamber temperature is above the temperature profile. In so doing, controller 105 maintains an optimal deposition process temperature within CVD chamber 101.

Figure 1B:
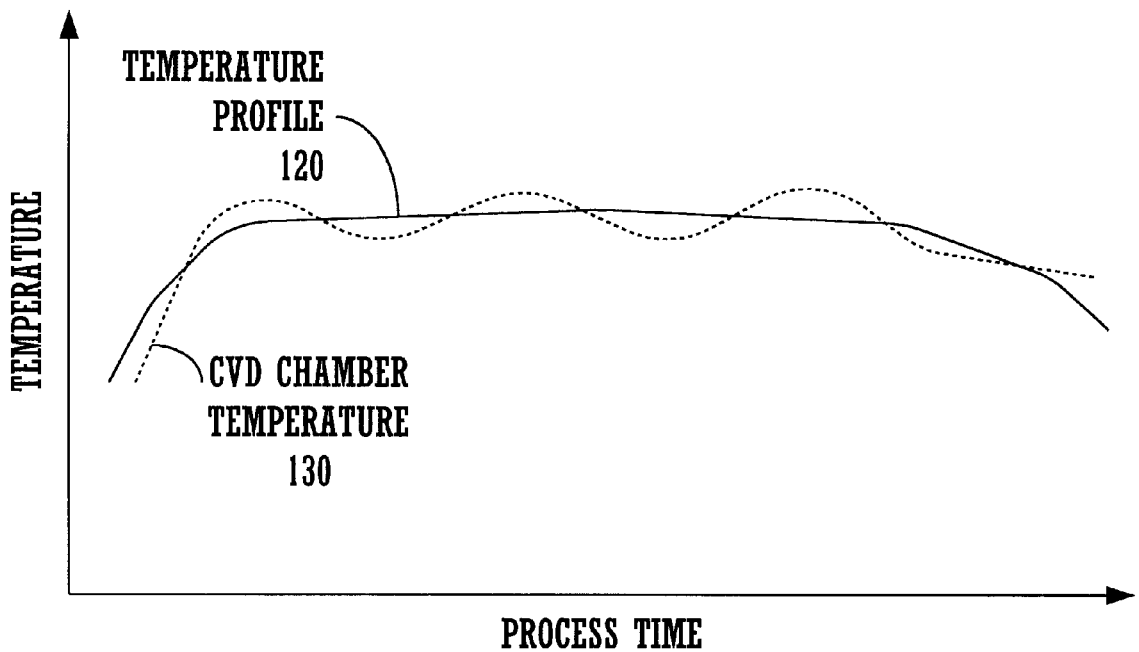
FIG. 1B shows a temperature profile for a CVD process in accordance with the present invention.

FIG. 1B shows a temperature profile (e.g., temperature profile 120) for a typical CVD process in accordance with the present invention. FIG. 1B shows a temperature profile curve 120 and a CVD chamber temperature curve 130 with respect to temperature (e.g., the vertical axis) and CVD process time (e.g., the horizontal axis). As described above, controller 105 maintains an optimal deposition process temperature (e.g., CVD chamber temperature) by turning on and turning off thermal lamp 103. For example, when the CVD chamber temperature falls below the temperature profile 120, thermal lamp 105 is turned on and when the CVD chamber temperature 130 rises above the temperature profile 120, thermal lamp 103 is turned off.

It should be noted that controller 105 implements a "closed loop" system for regulating the CVD chamber temperature. Thermal sensor 102 from FIG. 1A functions by supplying an analog temperature signal (e.g., analog temperature signal of line 104) characterizing the CVD chamber temperature. In the present embodiment, the voltage level of temperature signal of line 104 indicates the CVD chamber temperature. Temperature signal of line 104 is coupled to controller 105. Hence, controller 105 receives feedback regarding the CVD chamber temperature and adjusts the controller output 108 accordingly. This enables the controller 105 to closely follow the desired temperature profile (e.g., remain within 1–2 degrees C of nominal).

However, this feed back is one factor affecting the thermal runaway problems associated with prior art CVD machines. In CVD machines in accordance with the prior art, there exists the possibility of thermal runaway, where the thermal lamps (or other such heating elements) within the CVD chamber are commanded on by the machine's controller (e.g., to follow a temperature profile), and due to a malfunction, are not commanded to turn off. The resulting increase in temperature, as indicated by the machine's temperature sensor, is ignored or not seen by the prior art CVD machine's controller (e.g., due to a software fault, power supply voltage spike, electronic interference, component failure, etc.). Hence, the temperature within the CVD chamber "runs away", greatly exceeding thermal limits and damaging equipment within the CVD chamber, or even the CVD machine itself.

The present invention, in contrast to the prior art, ensures this type of thermal runaway does not occur. In accordance with the present invention, controller 105 of FIG. 1A controls thermal lamp 103 via controller output 108. Controller output 108 is coupled to interlock circuit 107, which is coupled to thermal lamp 103 via interlock circuit output 109. Hence, controller output 108 controls thermal lamp 103 via interlock circuit 107 and interlock circuit output 109. Consequently, regardless of controller output 108, the interlock output 109 is capable of turning off thermal lamp 103. The interlock circuit 107 is signaled to turn off thermal lamp 103 by comparison circuit output 110 from the comparison circuit 106. The comparison circuit 106 receives the same temperature signal (e.g., temperature signal 104) as controller 105. The comparison circuit protects against thermal runaway by monitoring temperature signal 104 independently and turning off thermal lamp 103 when the CVD temperature exceeds a built in thermal limit. The thermal limit is typically selected for a particular CVD machine, based upon a CVD chamber temperature above which thermal damage to wafers, equipment within the CVD chamber, or the CVD machine itself will occur. Such damage includes, thermally damaged wafers, melted susceptors, evaporating components and coating the inside of the CVD chamber with the evaporated material, and the like.

For example, during normal operation, the interlock circuit 107 functions in a closed state, wherein the controller output 108 is directly passed through to thermal lamp 103 as the interlock circuit output 109. Hence, controller 105 can directly control thermal lamp 103, thereby directly controlling the CVD chamber temperature. Comparison circuit 106 is coupled in parallel to receive temperature signal 104. Comparison circuit 106 continually compares temperature signal 104 to an internal reference voltage. In the present embodiment, the internal reference voltage corresponds to a maximum allowable CVD chamber temperature for CVD machine 100. Should the temperature signal 104 (as compared to the internal reference voltage) indicate an over-temperature condition, comparison circuit 106 sends a comparison circuit output over 110 to interlock circuit 107, causing interlock circuit 107 to transition to the open state.

In the open state, interlock circuit 107 functions as an open circuit with respect to controller 105. Commands from controller 105 (e.g., controller output 108) are no longer passed through via interlock circuit output 109. Instead, interlock circuit output 109 turns off thermal lamp 103. In this manner, the present invention protects CVD machine 100 against thermal runaway and protects CVD machine 100 and components within CVD machine 100 (e.g., suscepters) from over-temperature damage.

Thus, if controller 105 fails, comparison circuit 106 continues to receive feed back via temperature signal 104 and remains functional in accordance with the present invention. Since comparison circuit 106 is coupled in parallel with respect to temperature signal 104 and controller 105 and is designed to have a very high impedance, comparison circuit 106 does not interfere with the normal operation of controller 105. Consequently, embodiment 100 of the present invention can be readily integrated into prior art CVD machines and existing wafer fabrication lines and processes would not be adversely affected.

Figure 2:
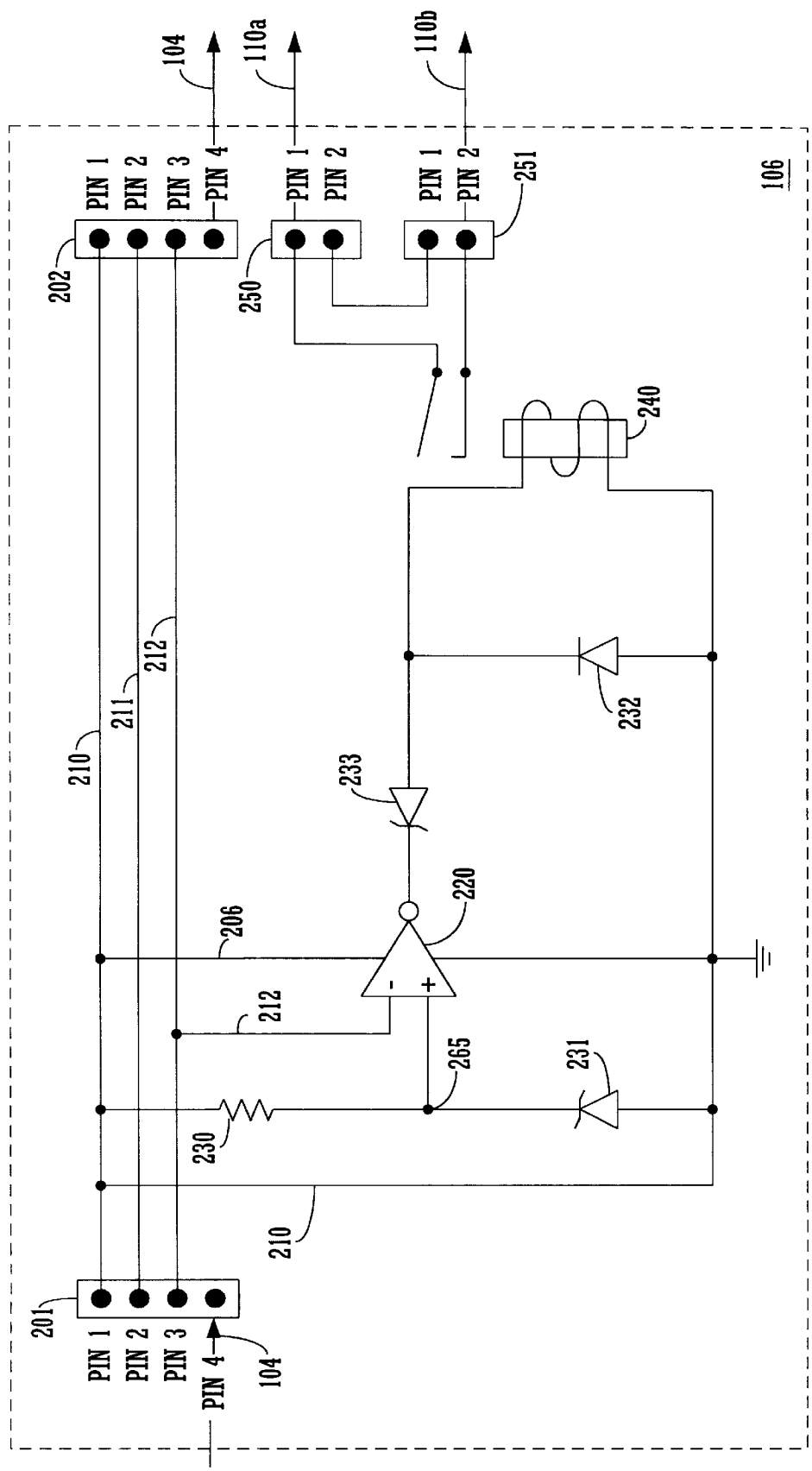
FIG. 2 shows a schematic diagram of a comparison circuit in accordance with the present invention.

Referring now to FIG. 2, comparison circuit 106 in accordance with one embodiment of the present invention is shown. Comparison circuit 106 includes a connector 201 and a connector 202. Connectors 201 and 202 couple to temperature signal line 104 on the left side and on the right side of comparison circuit 106 as shown. In one implementation, connectors 201–202 each have four input pins, PIN 1, PIN 2, PIN 3, and PIN 4. Lines 210, 211, and 212 respectively couple PINs 1–3 of connectors 201–202. In one embodiment, PIN 4 remains open to allow for the incorporation of any added optional functionality and is therefore optional. Line 210 is coupled to 15 v DC power supply, line 211 is coupled to a 15 v DC common ground line for CVD machine 100, and line 212 is coupled to temperature signal 104 via PIN 3 of connectors 201–202 respectively.

As described above, comparison circuit 106 couples in parallel with temperature signal 104. Lines 210, 211, and 212 are coupled in parallel to the temperature signal 104 via connectors 201–202. For example, where comparison circuit 106 is fabricated as a printed circuit board, connectors 201 and 202 couple temperature signal 104 straight through the circuit board with minimal electrical interference (e.g., added capacitance, noise, etc.). Temperature signal 104 is coupled to the negative (e.g., inverting) input of an op-amp 220 via line 212. The very high input impedance of op-amp 220 preserves the electrical characteristics of temperature signal 104. A resistor 230 and a zenner diode 231 are coupled to lines 210 and 211 to create a reference voltage at the positive (e.g., non-inverting) input of op-amp 220.

The reference voltage of op-amp 220 is created by the node 265 between resistor 230 and zenner diode 231. The zenner diode 231 functions by setting the voltage at the positive input of op-amp 220 (e.g., the reference voltage). This reference voltage is the "triggering" voltage for comparator circuit 106. In one embodiment, resistor 230 is a 10K resistor which is used to drop any residual voltage on line 210 which is not dropped by zenner diode 231. Accordingly, differing triggering voltages can be set within the present invention by using a different zenner diodes as zenner diode 231.

Op-amp 220 is used as a comparator to compare the voltage of the temperature signal over line 212 to the reference voltage. The voltage at the negative input of op-amp 220 (e.g., the temperature signal received via line 212) is compared to the voltage at the positive input (e.g., the reference voltage from the node 265 between resistor 230 and zenner diode 231). The output of op-amp 220 remains "high" (e.g., saturated) until the voltage of the temperature signal over line 212 increases above the reference or "triggering" voltage.

The high output from op-amp 220 energizes a relay 240 (e.g., in one embodiment, a 12 v DC normally open relay) and allows interlock circuit 107 (FIG. 1A) to pass current through the contacts of relay 240 (e.g., the comparison circuit output 110). When the temperature signal received via line 212 reaches a voltage level higher than reference voltage, the output of op-amp 220 switches low and the relay 240 de-energizes, cutting off the current from interlock circuit 107 and forcing it into its open state. When comparison circuit 106 is initialized, relay 240 is placed in its closed state.

In one embodiment, interlock circuit 107 (of FIG. 1A) is coupled to relay 240 (of FIG. 2) via a two pin connector 250 and a two pin connector 251. Connectors 250–251 each have first and second pins (e.g., PIN 1 and PIN 2), wherein their second pins are commonly coupled and their first pins are coupled to conduct current from interlock circuit 107 (e.g., 110a and 110b, which form comparison circuit output 110 from FIG. 1A).

A zenner diode 233 of FIG. 2 is coupled to the output of op-amp 220 to ensure a residual voltage from the output when the op-amp 220 is "low" (e.g., approximately 2.14 v) is dropped across zenner diode 233 and not relay 240. This ensures the relay 240 de-energizes when the output of op-amp 220 is low. A diode 232 is coupled in parallel with relay 240 and functions by debouncing relay 240. It should be noted that in the present embodiment, diode 232 is a "normal" (e.g., not a zenner) diode.

In accordance with one exemplary implementation of the present embodiment, a list of industry standard part descriptions for the components comprising comparison circuit 106 is presented in Table 1.

TABLE 1

| | |
|---|---|
| connectors 201–202: | Standard four pin PC board connectors; |
| connectors 250–251: | Standard two pin PC board connectors; |
| resistor 230: | 10K ohm ¼ watt; |
| zenner diode 231: | 1N4733A (5.1 v zenner); |
| diode 232: | 1N4001; |
| zenner diode 233: | 1N4370A (2.4 v zenner); |
| relay 240: | K1 12VSPDT (IDEC RSMIV-GU); |
| op-amp 220: | LM741CN (OPAMP). |

It should be appreciated that the configuration of Table 1 is for one implementation of comparison circuit 106 of the present invention. Different parts, having different part numbers, can be substituted without departing the scope of the present invention. As such, the present invention is well suited to modification in order to specifically tailor certain aspects for a particular contemplated use (for example, implementing comparison circuit 106 as a portion of an integrated circuit as opposed to discrete components on a printed circuit board).

It should be further appreciated that the present invention can be readily adapted to operate in conjunction with a variety of machines. For example, in an alternate embodiment, the comparison circuit of the present invention is readily installed in a CVD machine without disturbing the normal functionality of the CVD machine's controller. As described above, the temperature signal of the CVD machine is not disturbed (e.g., due to the high impedance of the comparison circuit and the fact that the temperature signal is coupled in parallel). Accordingly, a CVD machine's pre-existing functionality for an existing wafer fabrication line is not adversely impacted by the installation of the present invention.

In addition, it should be appreciated that in yet another embodiment, the comparison circuit 106 of the present invention can be used to compare other analog signals to a reference signal. For example, the present invention is well suited to preventing an overflow where the input signal (e.g., the analog signal coupled to line 212 from FIG. 2) represents a current content level in a water tank. As such, the comparison circuit of the present invention is not limited to CVD machines or the electronics industry.

Figure 3:
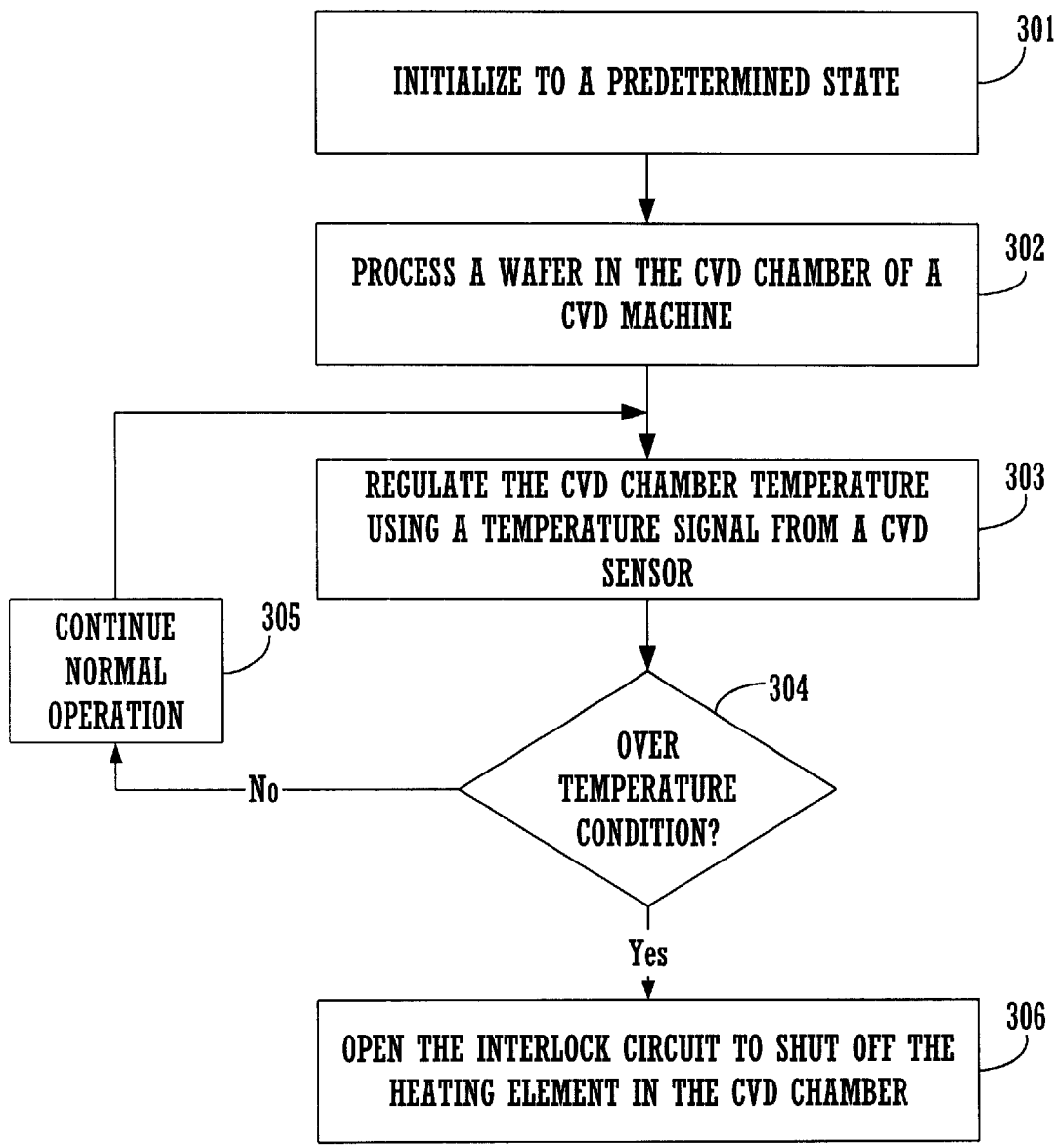
FIG. 3 shows a flowchart of the steps of an over-temperature protection process in accordance with one embodiment of the present invention.

Referring now to FIG. 3, the operation of an embodiment of the present invention is described with reference to a flow chart of the steps of process 300. Process 300 depicts the steps of the operating process of a CVD machine (e.g., CVD machine 100 from FIG. 1A) in accordance with the present invention.

Process 300 begins in step 301, where CVD machine 100 is initialized to a known state. This includes initializing CVD process settings to normal (e.g., loading the temperature profile into controller 105 of FIG. 1A, setting interlock circuit 107 to its closed state, and the like). In its closed state, interlock circuit 107 couples the controller output 108 from the controller 107 directly to the heating element (e.g., thermal lamp 103) within CVD chamber 101.

In step 302, CVD machine 100 implements CVD processing with CVD chamber 101. As described above, controller 105 controls heat lamps to implement a programmed temperature profile to effect the chemical reactions of the CVD process within the CVD chamber 101. Controller 105 provides controller output 108 to modulate the heat output of thermal lamp 103.

In step 303, controller 105 uses feed back from a thermal sensor 102 included in CVD chamber 101. As described above, thermal sensor 102 provides an analog temperature signal 104 to controller 105. This temperature signal provides closed loop feed back, which in turn, enables controller 105 to precisely control thermal lamp 103 to maintain a desired temperature (e.g., the temperature profile).

In step 304 of FIG. 3, a comparison circuit 106 in accordance with the present invention (e.g., comparison circuit 106) monitors temperature signal 104 to determine whether an over-temperature condition exists. As described above, comparison circuit 106 is coupled to temperature signal 104 in parallel with respect to controller 105. As described above, the temperature signal is coupled to the inverting input of an op-amp (e.g., op-amp 220) and is compared to a reference voltage representing the temperature at which interlock circuit 107 will be commanded to its open state (e.g., the maximum safe temperature allowable for CVD chamber). The reference voltage is formed by the node 265 between a resistor (e.g., resistor 230) and a zenner diode (e.g., zenner diode 231), which are serially coupled between 15 v DC and ground. This node 265 is coupled to the noninverting input of op-amp 220. Subsequent to initialization, comparison circuit 106 continually compares the temperature signal 104 to the reference voltage.

In step 305, where no over-temperature condition exists, comparison circuit 106 allows interlock circuit 107 to remain in its closed state, thus continuing normal operation. This allows controller 105 to continue modulating thermal lamp 103, and thereby maintain the desired temperature profile within the CVD chamber.

In step 306, where an over-temperature condition does exit (e.g., due to thermal lock up), comparison circuit 106 detects the over-temperature, signals the interlock circuit by opening an internal relay (e.g., relay 240), which in turn, causes the interlock circuit to transition to its open state. This de-couples the controller output 108 from thermal lamp 103, thereby turning off thermal lamp 103 and correcting the over-temperature condition.

Thus, the present invention provides a system which protects against thermal lock up in CVD machines. It is appreciated that the system of the present invention remains functional should the embedded systems within a CVD machine fail. The system of the present invention is easily integrated with existing CVD machines in existing wafer fabrication lines. In addition, the present invention provides protection against thermal lock up without interfering with sensor inputs and outputs used by the embedded systems within the CVD machines.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A thermal protection system in a chemical vapor deposition machine (CVD) comprising:
    a thermal sensor providing a temperature signal representing the temperature of a CVD chamber temperature;
    a heating component for heating said CVD chamber;
    an interlock circuit coupled to said heating component, said interlock circuit having a closed state for activating said heating component and an open state for inactivating said heating component;
    a controller coupled to receive said temperature signal and for regulating said temperature of said CVD chamber by controlling said heating component via said interlock circuit in response to said temperature signal; and
    a comparison circuit coupled to receive said temperature signal and for comparing said temperature signal and a reference and for controlling said interlock circuit to said open state when said temperature signal exceeds said reference to override said controller if said controller fails to prevent an overtemperature condition.

2. The system of claim 1, wherein said interlock circuit couples an output signal from said controller to said heating component when said interlock circuit is in said closed state and said interlock circuit de-couples said output signal from said controller when said interlock circuit is in said open state.

3. The system of claim 1, wherein said comparison circuit is coupled in parallel to said temperature signal with respect to said controller.

4. The system of claim 1, wherein said reference is provided by the voltage at a node between a resistor coupled to a power supply and a zenner diode coupled to ground.

5. The system of claim 1, wherein said comparison circuit includes a comparator coupled to receive said temperature signal and said reference and for determining whether the voltage of said temperature signal exceeds the voltage of said reference.

6. The system of claim 5, wherein said comparator is an operational amplifier circuit having a first input coupled to receive said temperature signal and a second input coupled to said reference.

7. The system of claim 1, wherein said comparison circuit includes a relay coupled to conduct a current from said interlock circuit, and wherein said interlock circuit is controlled to said open state when said relay is opened by said comparison circuit.

8. A thermal protection system in a chemical vapor deposition machine (CVD) comprising:
    a means for providing a temperature signal representing the temperature of a CVD chamber;
    a means for heating said CVD chamber;
    an interlock means coupled to said heating means, said interlock means having an open state for activating said heating means and a closed state for inactivating said heating means;
    a means for regulating said temperature of said CVD chamber coupled to receive said temperature signal and for regulating said temperature of said CVD chamber by controlling said heating means via said interlock means in response to said temperature signal; and
    a means for comparing said temperature signal and a reference voltage, said comparing means coupled to receive said temperature signal, said comparing means controlling said interlock means to said open state when said temperature signal exceeds said reference voltage to override said regulating means if said regulating means fails to prevent an over-temperature condition.

9. The system of claim 8, wherein said interlock means couples an output signal from said regulating means to said heating means when said interlock means is in said closed state and said interlock means de-couples said output signal from said regulating means when said interlock means is in said open state.

10. The system of claim 8, wherein said comparison means is coupled in parallel to said temperature signal with respect to said regulating means and wherein said comparison means exhibits high input impedance with respect to said temperature signal.

11. The system of claim 8, wherein said reference voltage is supplied by the voltage at a node between a resistor coupled to a power supply and a zenner diode coupled to ground.

12. The system of claim 8, wherein said comparison means includes a comparator coupled to receive said temperature signal and said reference and for determining whether the voltage of said temperature signal exceeds the voltage of said reference.

13. The system of claim 12, wherein said comparator is an operational amplifier circuit having a first input coupled to receive said temperature signal and a second input coupled to said reference.

14. The system of claim 8, wherein said comparison means includes means for relaying a current from said interlock means, said relaying means coupled to control said interlock means to said open state when said relaying means is opened by said comparison means.

15. A thermal protection system in a chemical vapor deposition machine (CVD) comprising:
    a thermal sensor operable for providing a temperature signal representing the temperature of a CVD chamber;
    a heating component coupled to said CVD chamber operable for heating said CVD chamber;
    an interlock circuit coupled to said heating component, said interlock circuit having a closed state operable for activating said heating component and an open state operable for inactivating said heating component;
    a controller coupled to said interlock circuit to receive said temperature signal, said controller operable for regulating said temperature of said CVD chamber by controlling said heating component via said interlock circuit in response to said temperature signal, wherein said controller is prevented from regulating said heating component when said interlock circuit is in said open state; and
    a comparison circuit coupled to said thermal sensor to receive said temperature signal, said comparison circuit operable for comparing said temperature signal and a reference, said comparison circuit operable for controlling said interlock circuit to said open state when said temperature signal exceeds said reference to override said controller if said controller fails to prevent an over-temperature condition.

16. The system of claim 15 wherein said interlock circuit is configured to couple an output signal from said controller to said heating component when said interlock circuit is in said closed state and said interlock circuit de-couples said output signal from said controller when said interlock circuit is in said open state.

17. The system of claim 15, wherein said comparison circuit is coupled in parallel to said temperature signal with respect to said controller.

18. The system of claim 15 wherein said reference is provided by the voltage at a node between a resistor coupled to a power supply and a zenner diode coupled to ground.

19. The system of claim 15 wherein said comparison circuit includes a comparator coupled to receive said temperature signal and said reference and to determine whether the voltage of said temperature signal exceeds the voltage of said reference.

20. The system of claim 19 wherein said comparator is an operational amplifier circuit having a first input coupled to receive said temperature signal and a second input coupled to said reference.

21. The system of claim 20 wherein said comparison circuit includes a relay coupled to conduct a current from said interlock circuit, and wherein said interlock circuit is controlled to said open state when said relay is opened by said comparison circuit.

* * * * *